United States Patent [19]

Marumoto

[11] Patent Number: 5,333,163

[45] Date of Patent: Jul. 26, 1994

[54] IC INCLUDING COUNTER CIRCUIT AND ONE CHIP MICROCOMPUTER THEREOF

[75] Inventor: Kyoji Marumoto, Kyoto, Japan

[73] Assignee: Rohm Co., Ltd., Kyoto, Japan

[21] Appl. No.: 998,059

[22] Filed: Dec. 29, 1992

[30] Foreign Application Priority Data

Jan. 7, 1992 [JP] Japan ................................. 4-018565

[51] Int. Cl.$^5$ ........................................... H03K 21/00
[52] U.S. Cl. ............................................... 377/39
[58] Field of Search ......................................... 377/39

[56] References Cited

U.S. PATENT DOCUMENTS

| | | | |
|---|---|---|---|
| 4,612,658 | 9/1986 | Eby | 377/39 |
| 4,835,480 | 5/1989 | Skupen et al. | 377/39 |
| 4,989,224 | 1/1991 | Narahara et al. | 377/39 |

Primary Examiner—Margaret Rose Wambach
Attorney, Agent, or Firm—Fay, Sharpe, Beall, Fagan, Minnich & McKee

[57] ABSTRACT

An IC according to the present invention contains a counter, which includes a plurality of incomplete coincidence detection circuits each associated with a different one of a corresponding number of flip-flops storing respective bit data of an aimed value, each incomplete coincidence detection circuit including a first logic element for receiving a Q or $\overline{Q}$ output of said associated flip-flop and a one-bit output from a bit location of the counter corresponding to the different flip-flop, and a second logic element for receiving an output of the first logic element and the other of the Q and $\overline{Q}$ output of the different flip-flop to provide a coincidence detection signal, the detection circuit being adapted to detect a coincidence of the aimed value with the count value when all of the incomplete coincidence detection circuits output the coincidence detection signals.

10 Claims, 5 Drawing Sheets

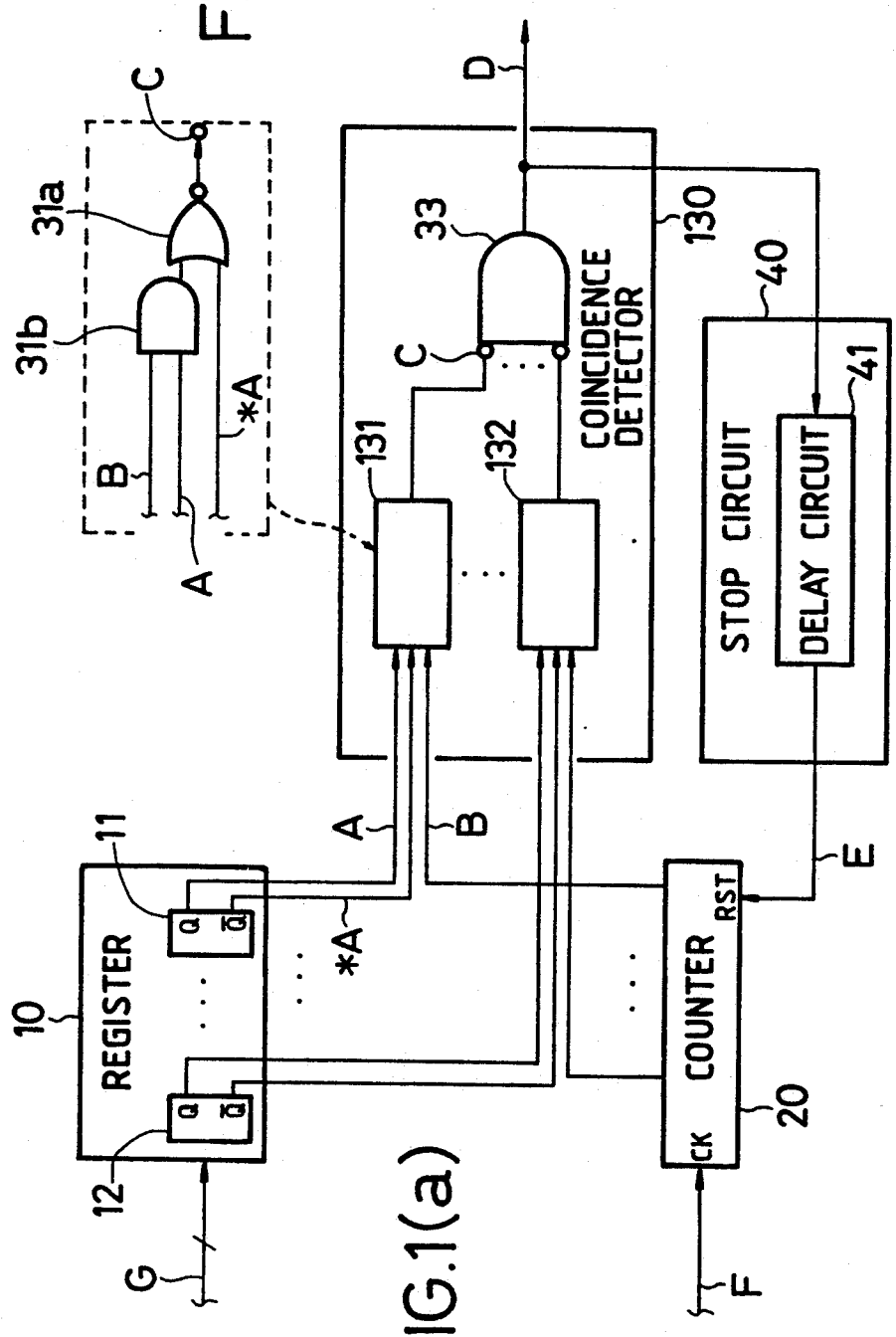

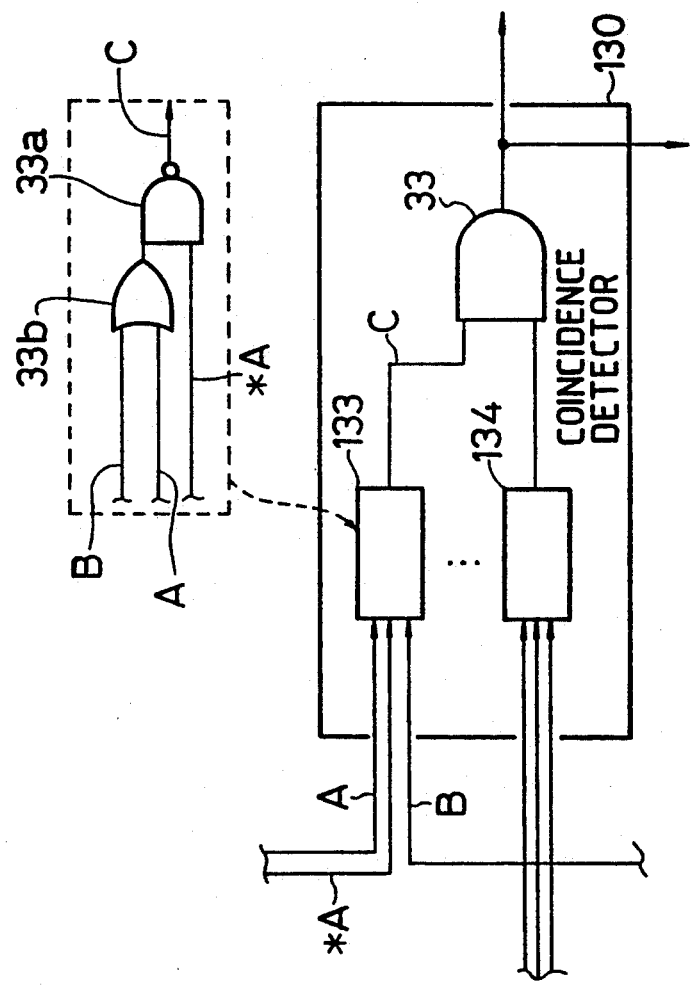

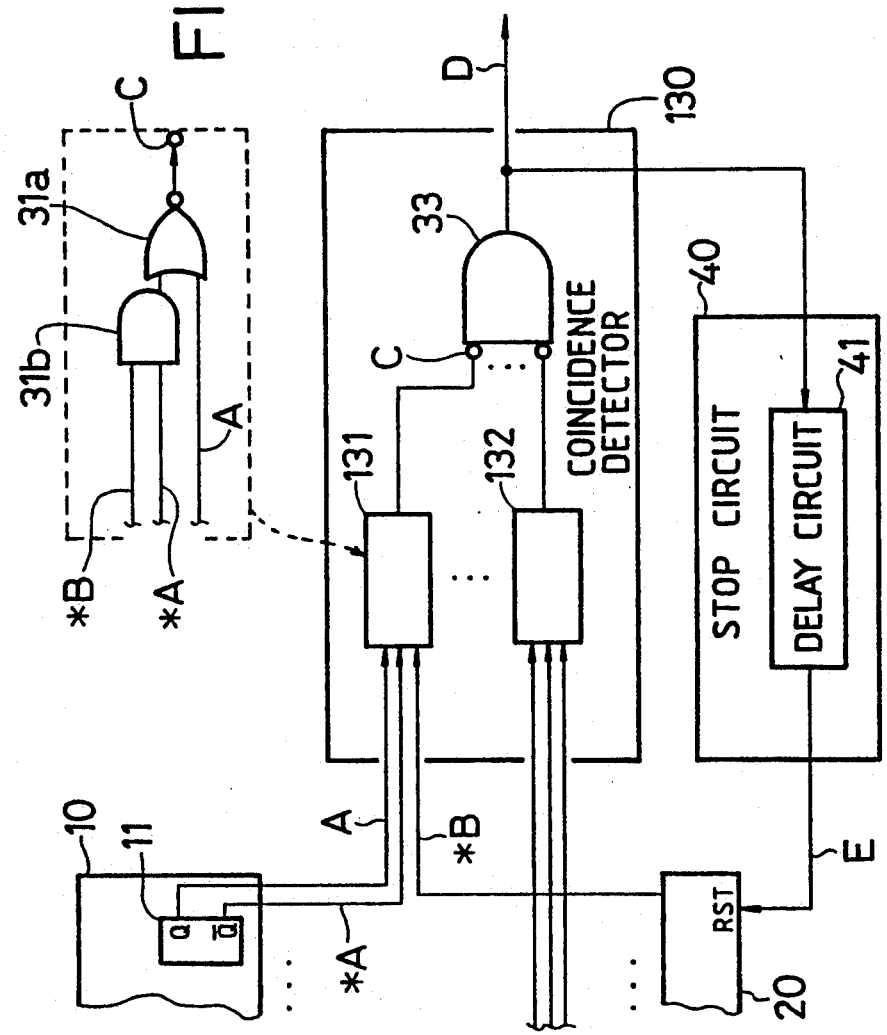

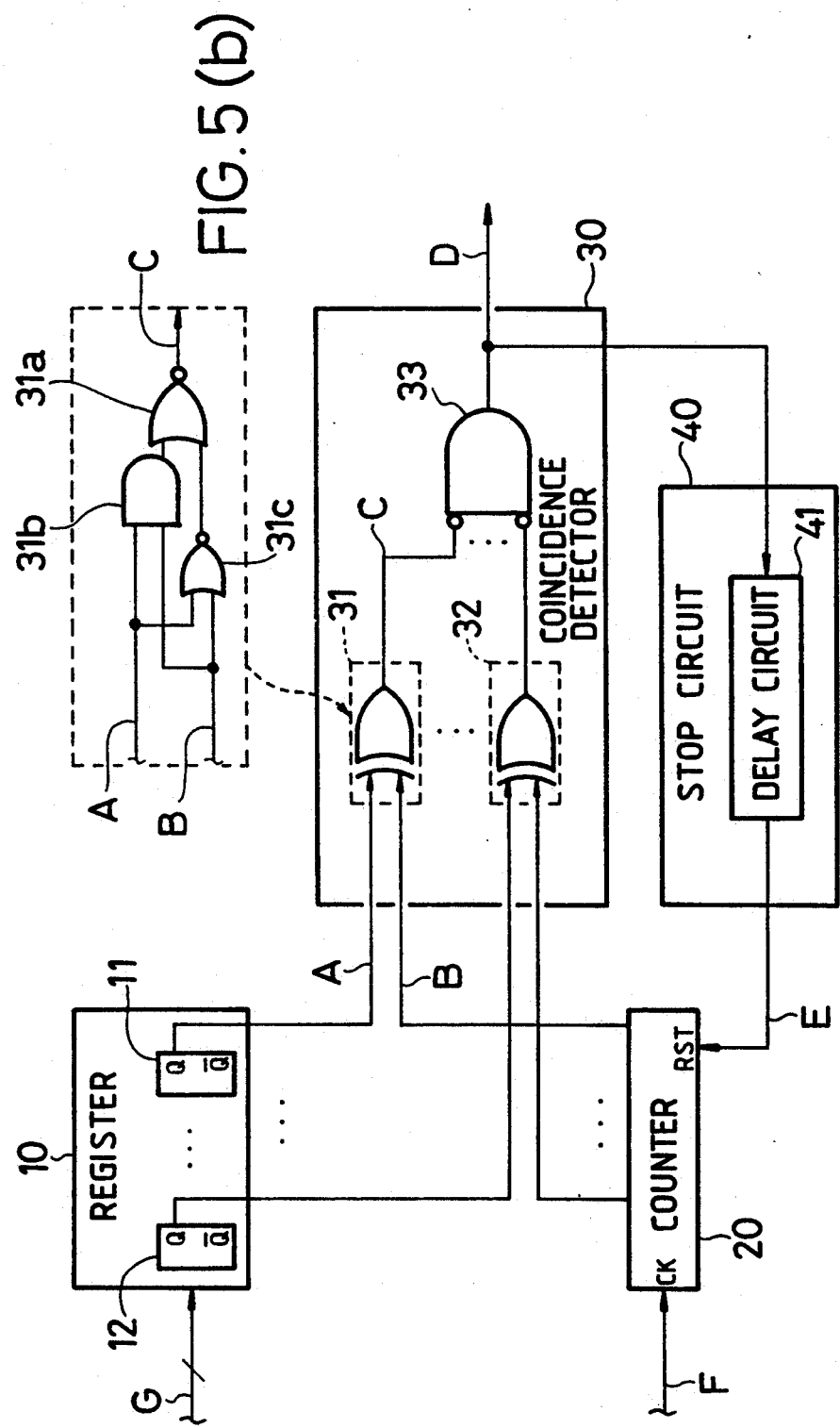

IC INCLUDING COUNTER CIRCUIT AND ONE CHIP MICROCOMPUTER THEREOF

BACKGROUND OF THE INVENTION

1. Technical Field

The present invention relates to an integrated circuit (IC) including a counter circuit and a one-chip microcomputer thereof and, particularly, to an IC including a counter circuit for outputting a count end pulse every time a desired value is counted, and which is capable of reducing the number of logic elements constituting the counter circuit so that other circuits can be integrated therewith.

2. Background Art

FIG. 5 shows a conventional counter circuit 100 included in an IC. The counter circuit 100 counts clock signals and externally supplied input signals until the total number reaches a set count, and then produces a count end pulse. Reference numerals 10, 20, 30 and 40 depict a register, a counter, a counter value coincidence detection circuit and a stop circuit for stopping production of the count end pulse, respectively.

The register 10 receives a data value G from other circuits and stores it. The counter 20 receives a countable signal F such as a clock signal, a event signal input externally, increments its count and, responsive to an initializing signal E, clears its count value.

The count coincidence detection circuit 30 includes single bit coincidence detection circuits corresponding in number to the number of bits of the register 10 and hence the counter 20, although only two, 31 and 32, of them are shown, and an end signal generator circuit 33 for producing a count end signal when all detection signals are generated.

The coincidence detection circuits 31 and 32 are provided for respective digits of the counter 20 and are usually constituted with exclusive OR elements. Each exclusive OR element receives an output signal A from a Q output of a flip-flop 11 for a certain digit of the register 10 and an output signal B of 1 bit corresponding to that digit of the counter 20, and outputs the result of an exclusive OR operation performed on them as a bit coincidence detection signal C. The end signal generator circuit 33 is usually constituted with an AND gate. In FIG. 5, a negative logic input AND gate 33 is used which provides a count end pulse D when all of the exclusive OR gates 31, 32 output the coincidence signals C.

The Stop circuit 40 is constituted with a delay circuit 41 in this example and is responsive to the count end pulse D to output an initializing signal E after a certain time has elapsed from a start of output of this signal. Upon receiving the initializing signal E, the counter 20 is initialized, so that the counter value becomes different from the aimed value held in the register 10. Therefore, the output of the AND gate 33 is stopped, which determines the width of the count end pulse D by a delay time of the delay circuit 41.

The initialized counter starts again to count the signal F up to the aimed value held in the register 10, and the above mentioned operation is repeated, so that the count end pulse D is generated whenever the counter counts the signals F corresponding in number to the aimed value. Such a counter circuit is included in an IC and used as a frequency divider and/or a timer, etc.

Usually, the coincidence detection circuit is constituted with the exclusive OR gates 31 and 32, each being constituted with a NOR gate 31c for receiving the A and B outputs, an AND gate 31b for receiving the A and B outputs and a NOR gate responsive to outputs of the NOR gate 31c and the AND gate 31b for providing the coincidence signal c. The exclusive OR gate 31 may be realized with 10 CMOS transistors, which means that the number of transistors is larger than that of an AND or an OR gate, which can be realized with several transistors.

Further, in such a counter circuit, the number of the coincidence detection circuits must correspond to the number of the digits of the aimed value. Therefore, the coincidence detection circuit 30 of this kind of counter circuit 100 occupies a large percentage of the area on a chip, which means that other circuits cannot be integrated on the same chip.

SUMMARY OF THE INVENTION

An object of the present invention is to provide an IC including a counter circuit which, when integrated on one chip, occupies a minimum area thereof.

Another object of the present invention is to provide an IC including a counter circuit, which can integrate a larger number of other circuits.

A further object of the present invention is to provide a one chip microcomputer having a counter circuit occupying a minimum area of the chip when integrated thereon.

In order to achieve the above objects, an IC including a counter circuit, according to the present invention, is featured by comprising a register including a plurality of parallel flip-flops set with bit data of an aimed value, a counter responsive to an initializing signal for initializing each bit of a count value thereof to "0" and then incrementing with signals to be counted, or initializing each bit of the count value thereof to "1" and then decrementing with signals to be counted, a plurality of coincidence detection circuits each comprising a first logic element for receiving one of Q and $\bar{Q}$ outputs of a certain one of said flip-flops and an output from a bit location of the counter corresponding to the certain flip-flop, and a second logic element for receiving an output of the first logic element and the other of the Q and $\bar{Q}$ output of the certain flip-flop to provide a coincidence detection signal, an end signal generator circuit responsive to the coincidence detection signals from all of the coincidence detection circuits for generating a count end signal indicative of an end of a counting operation of the counter, and an initializing signal generator circuit responsive to the count end signal for generating the initializing signal after a predetermined time lapses from the reception of the count end signal.

The coincidence detection circuits are each composed of two logic elements, which is less in number than that of the conventional coincidence detection circuits. Therefore, an area of the IC which is to be occupied by the coincidence detection circuits is smaller correspondingly and, if a total area of the IC is the same, it is possible to integrate other circuits thereon.

An operation of the coincidence detection circuit will be described for cases where the counter is an up-counter and a down-counter, respectively.

Since the coincidence detection circuit is constituted with two logic elements, it detects a coincidence when first and second inputs thereof are the same. Further, according to a combination of these logic elements, it detects a coincidence even when the two inputs are different. Therefore, the coincidence detection circuit is not a true coincidence detection circuit but an incomplete coincidence detection circuit.

When such a circuit is used as an up-counter circuit, it is enough to use a coincidence detection circuit including two logic elements and functioning to prevent generation of a coincidence signal when a bit of the counter output is "0" while a bit of the aimed value is "1". That is, an incomplete coincidence detection circuit which generates a coincidence signal when a bit of the aimed value and a bit of the counter value are the same or when a bit of the counter value is "0" while a bit of the aimed value is "0" is used.

The upper significant bit (USB), of bits of the aimed value which are "1", is "1" and an upper bit preceding therefrom to MSB unless the aimed value is "0". The up-counter circuit having all bits initialized to "0" starts its counting operation up to a value coincident with the aimed value. A bit of the counter corresponding to the USB of the aimed value is initially "0" necessarily and no coincidence signal for all bits of the aimed value is generated until the USB becomes "1". The coincidence detection circuits satisfying the above conditions always output a coincidence signal or signals so long as any bit or bits of the aimed value are "0".

However, since, in the up-counter, a coincidence of each bit is detected during the count value, which is incremented up to the aimed value, a coincidence detection for "0" between a certain bit of the counter and a corresponding bit of the aimed value is made first. Thus, detection of a case where a certain bit of the aimed value is "0" while a corresponding bit of the count value is "1" is made later, unless the counter value exceeds the aimed value. Further, when respective bits of the aimed value which are "1" coincide with those of the count value, all of the coincidence signals are provided. This is the case where all of the bits of the aimed value, except the USB, which are "1" coincide with " " of the corresponding bits of the counter and the bit of the counter corresponding to the USB of the aimed value becomes "1"; then all bits coincide. As mentioned previously, when the counter value is smaller than the aimed value, the coincidence for "0" is predominant. Therefore, when all bits coincide, the count value becomes equal to the aimed value, in response to which the count end signal generator circuit generates the count end signal.

For a down-counter, the relation between "1" and "0" in the case of the up-counter is reversed. That is, the coincidence detector is designed such that there is no coincidence signal generated when a certain bit of the counter is "1" and a corresponding bit of the aimed value is "0". In other words, the coincidence detector should be an incomplete coincidence detector which generates a coincidence signal when a certain bit of the counter is "1" and a corresponding bit of the aimed value is "1", or when a certain bit of the counter is "0" and a corresponding bit of the aimed value is "1".

As mentioned previously, the upper significant bit (USB) of bits of the aimed value which are "1" and an upper bit preceding therefrom to the MSB is "0". In the down-counter, a down count is started at a state where all bits thereof are "1" down to the aimed value. A bit of the counter corresponding to an upper bit preceding from the USB of the aimed value is initially "1" and then is changed to "0" in down counting and if there is a bit "0" closer to the least significant bit (LSB) of the aimed value, there is no coincidence signal indicating coincidence of all bits generated until a bit of the counter corresponding thereto become s "0".

The coincidence detector satisfying the above mentioned conditions always outputs coincidence signals for bits of the aimed value which are "1". In the down-counter, as a coincidence of each bit is detected while the count value is decremented down to the aimed value, a coincidence detection for "1" between a certain bit of the counter and a corresponding bit of the aimed value is made first. Thus, a detection of a case where a certain bit of the aimed value is "1" while a corresponding bit of the count value is "0" is made later, unless the counter value becomes smaller than the aimed value. Further, when respective bits of the aimed value which are "0" coincide with those of the count value, all of the coincidence signals are provided. This is the case where an upper bit preceding from the USB to the MSB of the aimed value is "0" and coincides with "0" of a corresponding bit of the counter and then bits of the aimed value (except for an upper bit preceding from the USB to the MSB) which are "0" coincide with "0" of corresponding bits of the counter. As mentioned previously, when the counter value is larger than the aimed value, the coincidence for "1" is predominant. Therefore, when all bits coincide, the count value becomes equal to the aimed value, in response to which the count end signal generator circuit generates the count end signal.

Thus, in the up-counter which is simply incremented up to the aimed value or in the down-counter which is simply decremented down to the aimed value, the coincidence detection circuit can be constructed with two logic elements and thus it is possible to reduce the number of transistors required.

As described, in the IC including the counter according to the present invention, the coincidence detection circuit can be constituted with not three logic elements but two logic elements by utilizing the counting characteristics of the counter. Therefore, the size of the counter circuit can be reduced, causing an area occupied thereby to be reduced. As a result, it is possible to increase the integration density of other circuits on the chip.

BRIEF DESCRIPTION OF THE DRAWINGS

FIGS. 1(a) and 1(b) show is a block circuit diagram of an up-counter circuit included in an IC according to the present invention;

FIG. 2(a) and 2(b) show is a block circuit diagram of a coincidence detection circuit when a down-counter circuit is included in an IC according to the present invention;

FIG. 2(b) and 2(b) show is a block circuit diagram of another coincidence detection circuit when a down-counter circuit is included in an IC according to the present invention;

FIGS. 5(a) and 5(b) show a block circuit diagram of a counter circuit included in a conventional IC.

DESCRIPTION OF THE PREFERRED EMBODIMENTS

Figure 3:
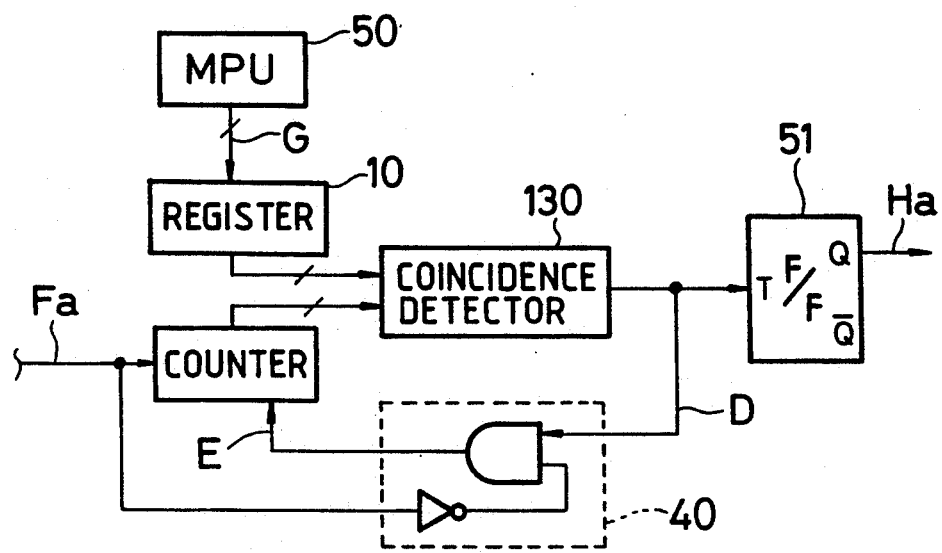
FIG. 3 is a block circuit diagram of an embodiment of a single chip microcomputer composed of an IC including a counter circuit according to the present invention.

In FIGS. 1(a) and 1(b), reference numerals 10, 20, 130 and 40 depict a register, a counter, a coincidence detector and a stop circuit, respectively, all of which, except the coincidence detector 130, are the same as those shown in FIG. 5(a) and 5(b).

The register 10 receives an aimed value setting signal G (bit data) and stores it in flip-flops 11, 12 provided correspondingly to respective bit positions of the data. In this figure, the $\overline{Q}$ output of each flip-flop is depicted by *A. Further, the Q and the $\overline{Q}$ outputs of each flip-flop can be sent by wiring to other circuits which are to be integrated simultaneously.

The counter 20 is, in this embodiment, an up-counter whose operation has been described previously.

The coincidence detector 130 is composed of coincidence detection circuits 131 and 132 and an end signal generator circuit 33 for detecting generation of coincidence signals C from all of the bits. The end signal generator circuit 33 generates a count end pulse D when all bits of an aimed value coincide with all bits of the count value held in the counter circuit 20, in the same manner as that in the previously described coincidence detection circuit 30.

The coincidence detection circuits 131 and 132 are identical in construction and detect coincidence between each bit of the register 10 and a corresponding bit of the counter 20, respectively. The coincidence detection circuit 131 is shown in detail in a dotted box in FIG. 1. As shown, the coincidence detection circuit 131 is composed of an AND gate 31b that receives a signal A which is a Q output of the flip-flop 11 and a signal B which is an output of a corresponding bit of the counter 20, and a NOR gate 31a responsive to an output of the AND gate 31b and the $\overline{Q}$ output *A of the flip-flop 11 for generating a coincidence signal C. For simplicity of explanation, a negative logic input symbol (o) on the input side of the AND gate 33 is moved to an output side of the NOR gate 31a to treat the negative logic input AND gate 33 as if it were a positive logic AND gate and to make an input signal to the AND gate 33 as a coincidence signal C (positive logic significance). The use of *A outputs in the IC is possible by only means of wiring without using any special circuit and/or method. Thus, it is possible to eliminate one logic element, compared with the conventional counter. The coincidence detection circuit can be constituted with, for example, 6 CMOS transistors, which means that, for each coincidence detection circuit, 4 CMOS transistors can be replaced by other circuits, compared with the conventional coincidence detection circuit which requires 10 CMOS transistors.

The AND gate 31b receives the A output of the flip-flop 11 of the register 10 and the B output of the counter 20 and provides a "0" output whenever the A output is "0". As a result, the NOR gate 31a always receives "0" and "1" inputs and thus provides a "0" output negation of which is the output of the coincidence detection circuit 131. As a result, the "1" coincidence signal C is generated. When the A output is "1", the AND gate 31b provides a "1" output if the B output is "1". Since the *A output is "0", the inputs of the NOR gate 31a are always "1" and "0". Therefore, the output of the NOR gate 31a becomes "0" the negation of which is the output of the coincidence detection circuit 13 1. As a result, a coincidence signal C of "0" is output.

On the other hand, when the A output is "1" and the B output is "0", the AND gate 31b provides a "0" output. Since the *A output is "0", the inputs of the NOR gate 31a are always "0" and "0". Therefore, the output of the NOR gate 31a is "1", the negation of which is "0". As a result, the coincidence signal C becomes "0" and there is no output of the coincidence detection circuit 131 generated.

From the foregoing, it is clear that, when the A output is "0", that is, when a certain bit of the aimed value is "0", the output of the coincidence detection circuit 131 is always "1". Therefore, even if the B output of the counter 20 is changed from "0" to "1" causing these outputs to be inconsistent, the coincidence signal C is generated. However, for the reason previously mentioned, there is no problem even if the output of the coincidence detection circuit 131 is "1" when the A output is "0". When the aimed value and the count value coincide, the coincidence is detected and the count end pulse D is generated at the output of the coincidence detector.

The number of the coincidence detection circuits of the coincidence detector 130 corresponds to the maximum number of bits of the counter 20 or the maximum number of bits of the aimed value set in the register 10, although only two (131 and 132) of them are shown in FIG. 1. The count end pulse D rises by the AND gate 33 when coincidence signals C of "1" are output simultaneously.

The coincidence detector itself is not a turn coincidence as detector capable of detecting an exact coincidence, as it does not employ the count value of the counter 20 at a value greater than r equal to the aimed value since, when the count value is smaller than the aimed value, there are no coincidence signals for all of the bits and the count value, upon reaching the aimed value, is reset to "0" by the initializing signal E .from the stop circuit 40. Therefore, for the up-counter circuit, such an incomplete coincidence detection circuit is sufficient.

The counter 20 is initialized to "0" by the initializing signal E, which is output by the delay circuit 41 a predetermined timing after the count end pulse D is issued. Upon initialization, the count value of the counter 20 becomes inconsistent with the aimed value held in the register 10 and thus the output of the AND gate 33 is stopped. The initialized counter 20 then restarts its counting operation.

A case where the counter 20 is a down-counter will be described with reference to FIGS. 2(a)-2(d). In FIG. 2(a), the coincidence detection circuits 131 and 132 shown in FIG. 1 are replaced by coincidence detection circuits 133 and 134. Since portions other than these detection circuits are the same as those shown in FIG. 1, these portions are omitted in FIG. 2.

The down-counter 20 decrements from its count value of all is by the initializing signal E.

In the coincidence detection circuits 133 and 134, "0" and "1" are inverted with respect to those in the coincidence detection circuits in FIG. 1 and, when a certain bit of the aimed value is "1", a coincidence signal C is output therefor. When a certain bit of the aimed value is "0", a coincidence signal C is output if a B output of a bit of the counter corresponding thereto becomes "0".

The coincidence detection circuits 133 and 134 are identical in construction and so the coincidence detection circuit 133 will be described as a representative of both. The coincidence detection circuit 133 is composed of an OR gate 33b which receives a signal A and a signal B, and a NAND gate 33a responsive to an output of the OR gate 33b and a *A output of the flip-flop 11 for generating a coincidence signal C. The negative logic AND gate 33 is changed to a positive logic AND gate 33.

When the A output is "1", the output of the OR gate 33b becomes "1" regardless of the value of the B output and, since the *A output is "0", the NAND gate 33a outputs "1". Thus, the output of the coincidence detection circuit 133 is always "1". On the other hand, when the A output is "0", the output of the OR gate 33b becomes "0" only when the B output is "0". Since the *A output is "1" at this time, the output of the NAND gate 33a becomes "1". As a result, the output of the coincidence detection circuit 133 becomes "1".

When the A output is "0" and the B output is "1", the output of the OR gate 33b becomes "1". Since the *A output is "1", the inputs of the NAND gate 33a are always "1"; therefore, the output of the NAND gate 33a becomes "0". As a result, the coincidence signal C of "0" is output and thus there is no output provided by the coincidence detection circuit 133.

From the foregoing, it is clear that, when the A output is "1", that is, when a certain bit of the aimed value is "1", the output of the coincidence detection circuit 133 is always "1". Therefore, even if the B output of the counter 20 is changed from "1" to "0" causing these outputs to be inconsistent, the coincidence signal C is generated. However, for the reason previously mentioned, there is no problem even if the output of the coincidence detection circuit 133 is "1" when the A output is "1". When the aimed value and the count value coincide, the coincidence is detected and the count end pulse D is generated at the output of the coincidence detector.

In response to the count end pulse D, the stop circuit 40 supplies the initializing signal E upon which all of the bits of the counter 20 are reset to "1". In this manner, the decrement operation of the counter 20 from the all "1" bit state to the aimed value is repeated.

In the case of down counting, there is no case where the count value becomes smaller than the aimed value. Therefore, it is possible to use the incomplete coincidence detector in the down counting.

It is usual to constitute the counter 20 with flip-flops. Therefore, the B output and the *B output (inversion of the B output) can be derived by means of wiring. FIGS. 2(c) and 2(d) shows a circuit for deriving the *B output and supplying it by inverting logical values of the input signals of the coincidence detection circuit 131, which is used as a down-counter. Since it is enough to invert the logic of the embodiment in FIG. 1, description thereof is omitted.

Similarly, a circuit for deriving the *B output and inputting it by inverting the input signal logic values of the coincidence detection circuit 133 in FIG. 2(a) is possible, which may be used as an up-counter.

FIG. 3 shows a single chip microcomputer including the counter circuit shown in FIG. 1. In FIG. 3, a reference numeral 50 depicts a microprocessor (MPU) and 51 a flip-flop of toggle type.

The microprocessor 50 sets an aimed value in a register 10 through an aimed value setting signal G.

The flip-flop 51 inverts an output Ha every reception of the count end pulse D.

The counter 20 is the same as that shown in FIG. 1, which may be either an up-counter or a down-counter. The counter circuit functions as a frequency divider circuit. Therefore, a basic clock signal is used as a signal Fa to be counted. The signal Fa is frequency-divided according to the aimed value and the count end pulse D is output to the flip-flop 51. The stop circuit 40 serves to generate the initializing signal E by utilizing the basic clock signal Fa to generate the count end pulse D, which has a width corresponding to half a clock signal pulse.

With this circuit construction, since the output Ha is inverted upon reception of the count end pulse, the output Ha becomes a signal whose frequency is divided with a width corresponding to the aimed value with respect to the clock signal Fa.

The IC of this embodiment is applied to a single chip microcomputer having a programmable frequency-divided clock generator circuit and is used for, example, for FDD control, etc. In such a case, an area on which circuits other than the counter circuit are to be integrated is increased.

Figure 4:
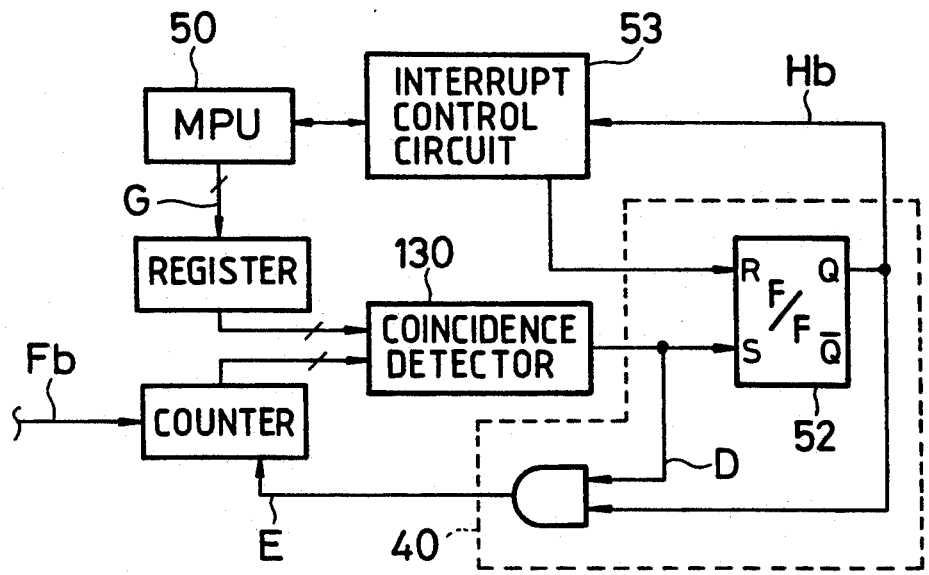
FIG. 4 is a block circuit diagram of another embodiment of a single chip microcomputer composed of an IC including a counter circuit according to the present invention.

FIG. 4 shows another embodiment of a single chip microcomputer including a counter circuit. Reference numeral 52 depicts a set/reset flip-flop and 53 depicts an interrupt control circuit.

The microprocessor 50 sets an aimed value in a register 10 through an aimed value setting signal G and receives an interrupt request from the interrupt control circuit 53.

An output Hb of the flip-flop 52 is set and held upon receipt of every count end pulse D, and is and reset under control of the interrupt control circuit 53 to stop the generation of the output Hb.

The interrupt control circuit 53 sends the signal Hb which is the interrupt request to the microprocessor 50. When the microprocessor accepts the request, the flip-flop 52 is reset.

Thus, the microprocessor 50 is interrupted every time a count end pulse D is generated.

The counter may function as a counting circuit for counting, for example, external events. Therefore, the external event detection signal is assigned to the signal Fb to be counted. It is counted up to the aimed value and a count end pulse D is output to the flip-flop 52 every time counting is completed. The stop circuit 40 generates the initializing signal E by utilizing the output Hb of the flip-flop 52. Therefore, the count end pulse D continues until the operation of the flip-flop 52 terminates.

What is claimed is:

1. An integrated circuit including a counter circuit therein which is to be initialized after incrementing signals to be counted up to an aimed value or decrementing the signals down to the aimed value, comprising:

a register including a plurality of parallel flip-flops set with bit data of the aimed value;

a counter responsive to an initializing signal for initializing each bit of a count value thereof to "0" and then incrementing with signals to be counted, or initializing each bit of the count value thereof to "1" and then decrementing with signals to be counted;

a plurality of coincidence detection circuits each comprising a first logic element for receiving one of Q and $\bar{Q}$ outputs of a respective one of said flip-flops and an output from a bit location of said counter corresponding to said respective flip-flop, and a second logic element for receiving an output of said first logic element and the other of the Q and $\overline{Q}$ output of the respective flip-flop to provide a coincidence detection signal;

an end signal generator circuit responsive to the coincidence detection signals from all of said coincidence detection circuits for generating a count end signal indicative of an end of a counting operation of said counter; and an initializing signal generator circuit responsive to the count end signal for generating the initializing signal after a predetermined time lapses from the reception of the count end signal.

2. The integrated circuit claimed in claim 1, wherein said coincidence detection circuit generates said coincidence signal when one of said Q and $\overline{Q}$ outputs of said respective flip-flop and said output from said corresponding bit location of said counter are both "0" or both "1" or, if said counter is an up-counter, said coincidence detection circuit generates said coincidence signal when said one of said Q and $\overline{Q}$ outputs of said respective flip-flop is "0" and said output from said corresponding bit location of said counter is "1" or, if said counter is a down-counter, said coincidence detection circuit generates said coincidence signal when said one of said Q and $\overline{Q}$ outputs of said respective flip-flop is "1" and said output from said corresponding bit location of said counter is "0".

3. The integrated circuit claimed in claim 1, wherein all bits of said counter are initialized to "0" by said initializing signal and said counter is incremented by counting said signals to be counted, and wherein said first logic element is an AND element and said second logic element is a NOR element.

4. The integrated circuit claimed in claim 3, wherein said register stores bit data of said aimed value in said respective flip-flops, and said initialized signal generator circuit includes a delay circuit for stopping generation of said count end signal.

5. The integrated circuit claimed in claim 1, wherein all bits of said counter are initialized to "1" by said initializing signal and said counter is decremented by counting said signals to be counted, and wherein said first logic element is an OR element and said second logic element is a NAND element.

6. The integrated circuit claimed in claim 1, wherein all bits of said counter are initialized to "1" by said initializing signal and said counter is decremented by counting said signals to be counted, and wherein said first logic element is an AND element and said second logic element is a NAND element.

7. The integrated circuit including a counter circuit therein which is to be initialized after being incremented by counting signals to be counted up to an aimed value, comprising:

a register including a plurality of parallel flip-flops set with bit data of the aimed value;

a counter responsive to an initializing signal for initializing each bit of a count value thereof to "0" and then incrementing with signals to be counted;

a coincidence detection circuit group including a plurality of incomplete coincidence detection circuits provided correspondingly to respective ones of said flip-flops, each incomplete coincidence detection circuit comprising an AND element for receiving one of Q and $\overline{Q}$ outputs of a corresponding one of said flip-flops and an output from a bit location of said counter corresponding to said corresponding flip-flop, and a NOR element for receiving an output of said AND element and the other of the Q and $\overline{Q}$ outputs of said corresponding flip-flop;

a full coincidence detection circuit responsive to output of said incomplete coincidence detection circuits for detecting a coincidence of all of said outputs of said incomplete coincidence detection circuits to generate a coincidence detection output; and an initializing signal generator circuit responsive to said coincidence signal for generating said initializing signal after a predetermined time lapses from the reception of said coincidence detection signal.

8. An integrated circuit including a counter circuit, comprising:

a register including a plurality of flip-flops set with bit data of the aimed value;

a counter responsive to an initializing signal for initializing each bit of a count value thereof to "0" or "1" and then incrementing or decrementing with signals to be counted;

a detection circuit including a plurality of coincidence detection circuits each comprising a first logic element for receiving one of Q and $\overline{Q}$ outputs of a respective one of said flip-flops and a one-bit output from a bit location of said counter corresponding to said respective flip-flop and a second logic element for receiving an output of said first logic element and the other of the Q and $\overline{Q}$ outputs of the respective flip-flop to provide a coincidence detection signal, said detection circuit being adapted to start outputting a count end signal when an all-bit coincidence detection signal is output; and a stop circuit for stopping said count end signal by outputting said initializing signal at a predetermined timing from said start of outputting said count end signal.

9. A one-chip microcomputer including a counter circuit which is incremented up or decremented down to an aimed value by counting signals to be counted so as to be initialized, comprising:

a register including a plurality of flip-flops set with bit data of the aimed value;

a counter responsive to an initializing signal for initializing each bit of a count value thereof to "0" and then incrementing with signals to be counted or initializing each bit of the count value thereof to "1" and then decrementing with signals to be counted;

a plurality of coincidence detection circuits corresponding in number to said flip-flops, each coincidence detection circuit comprising a first logic element for receiving one of Q and $\overline{Q}$ outputs of a respective one of said flip-flops and an output from a bit location of said counter corresponding to said respective flip-flop and a second logic element for receiving an output of said first logic element and the other of the Q and $\overline{Q}$ outputs of the respective flip-flop to provide a coincidence detection signal;

an end signal generator circuit responsive to the coincidence detection signals from all of said coincidence detection circuits for generating a count end signal indicative of an end of a counting operation of said counter; and an initializing signal generator circuit responsive to the count end signal for generating the initializing signal after a predetermined time lapses from the reception of the count end signal.

10. The one-chip microcomputer claimed in claim 9, wherein said coincidence detection circuit generates said coincidence signal when one of said Q and $\overline{Q}$ outputs of said respective flip-flop and said output from said corresponding bit location of said counter are "0" or "1" or, where said counter is an up-counter, said coincidence detection circuit generates said coincidence signal when said one of said Q and $\overline{Q}$ outputs of said respective flip-flops is "0" and said output from said corresponding bit location of said counter is "1" or, where said counter is a down-counter, said coincidence detection circuit generates said coincidence signal when said one of said Q and $\overline{Q}$ outputs of said respective flip-flop is "1" and said output from said corresponding bit location of said counter is "0".

* * * * *